US008722455B2

(12) United States Patent
Song et al.

(10) Patent No.: US 8,722,455 B2
(45) Date of Patent: May 13, 2014

(54) PHASE CHANGE MEMORY STRUCTURE HAVING LOW-K DIELECTRIC HEAT-INSULATING MATERIAL AND FABRICATION METHOD THEREOF

(75) Inventors: Zhitang Song, Shanghai (CN); Liangcai Wu, Shanghai (CN); Songlin Feng, Shanghai (CN)

(73) Assignee: Chinese Academy of Sciences, Shanghai (CN)

( * ) Notice: Subject to any disclaimer, the term of this patent is extended or adjusted under 35 U.S.C. 154(b) by 0 days.

(21) Appl. No.: 13/202,955

(22) PCT Filed: Jun. 24, 2011

(86) PCT No.: PCT/CN2011/076309
§ 371 (c)(1),
(2), (4) Date: Aug. 23, 2011

(87) PCT Pub. No.: WO2012/041085
PCT Pub. Date: Apr. 5, 2012

(65) Prior Publication Data
US 2013/0175493 A1 Jul. 11, 2013

(30) Foreign Application Priority Data

Sep. 28, 2010 (CN) .......................... 2010 1 0295914

(51) Int. Cl.
*H01L 21/06* (2006.01)
*H01L 21/20* (2006.01)
*H01L 21/8258* (2006.01)
*H01L 29/792* (2006.01)

(52) U.S. Cl.
CPC ........ *H01L 21/8258* (2013.01); *H01L 29/7923* (2013.01)
USPC ................... 438/102; 438/381; 257/E21.068

(58) Field of Classification Search
CPC ............ H01L 45/1253; H01L 45/1293; H01L 21/8258; H01L 29/7936; H01L 9/3247; G06F 12/08
USPC .......................... 438/102, 381; 257/E21.068
See application file for complete search history.

(56) References Cited

U.S. PATENT DOCUMENTS

| 8,551,840 B2* | 10/2013 | Hwang ......................... 438/283 |
| 2008/0149909 A1* | 6/2008 | Philipp et al. ...................... 257/3 |
| 2009/0185411 A1* | 7/2009 | Happ et al. ..................... 365/163 |
| 2010/0072453 A1* | 3/2010 | Jeong et al. ........................ 257/5 |

* cited by examiner

*Primary Examiner* — David S Blum
(74) *Attorney, Agent, or Firm* — Ming Chow; Sinorica, LLC

(57) ABSTRACT

The present invention discloses a phase change memory structure having low-k dielectric heat-insulating material and fabrication method thereof, wherein the phase change memory cell comprises diode, heating electrode, reversible phase change resistor, top electrode and etc; the heating electrode and reversible phase change resistor are surrounded by low-k dielectric heat-insulating layer; an anti-diffusion dielectric layer is designed between the reversible phase change resistor and the low-k dielectric heat-insulating layer surrounding thereof. The present invention utilizes low-k dielectric material as heat-insulating material, thereby avoiding thermal crosstalk and mutual influence during operation between phase change memory cells, enhancing the reliability of devices, and eliminating the influence of temperature, pressure and etc. on phase change random access memory (PCRAM) data retention during the change from amorphous to polycrystalline states. Furthermore, an anti-diffusion dielectric layer is prepared between the low-k dielectric material and the phase change material, which can be used to prevent the elements of the phase change material from diffusing to low-k dielectric material. The fabrication process of said phase change memory is compatible with standard complementary metal-oxide semiconductor (CMOS) process and the chemical mechanical polishing (CMP) process with low pressure and light corrosion is adopted in polishing.

6 Claims, 3 Drawing Sheets

PHASE CHANGE MEMORY STRUCTURE HAVING LOW-K DIELECTRIC HEAT-INSULATING MATERIAL AND FABRICATION METHOD THEREOF

FIELD OF THE INVENTION

This invention relates to a phase change memory structure and fabrication method thereof, and more particularly to a phase change memory structure utilizing low-k dielectric material as heat-insulating material and fabrication method thereof, belonging to the field of special devices and technology in microelectronics.

BACKGROUND OF THE INVENTION

Among current novel memory technologies, phase change memory (also known as phase change random access memory, PCRAM) based on chalcogenide semiconductor material has attracted worldwide attention by its outstanding advantages such as low cost, high speed, high memory density, simple process and nice compatibility with present complementary metal-oxide semiconductor (CMOS) process of integrated circuits. It is one of the main research directions to reduce the current and power consumption and to enhance the data retention and the reliability of phase change material. Many famous companies in the world have devote themselves to the research on phase change memory, mainly comprising Ovonyx, Intel, Samsung, IBM, Bayer, ST Micron, AMD, Panasonic, Sony, Philips, British Areospace, Hitachi and Macronix.

In order to reduce the power consumption and enhance the data retention and reliability, efforts can be made in two aspects: material and device structure. With regard to the device structure, there are various kinds of methods to achieve improvements. The structure of phase change memory can be divided into the following: classic "mushroom" structure, μ-Trench structure, Pore structure, GST limited structure, edge contact structure, quantum wire structure, GST spacer structure and etc. The key point of the classic T-shape structure lies in the fabrication of the bottom heating electrode, so the operation region reduction of this kind of structure can only be achieved by reducing the bottom electrode so as to reduce the operation voltage and power consumption. The purpose of any kind of structure is to reduce the contact area between electrode and phase change material and thus reduce the reversible phase change region of SET and RESET for lower current and power consumption. The decrease of the operation current shows an obvious linear relationship with the reduction of the phase change region, wherein the reduction of the phase change operation region can be realized mainly by two methods: decreasing the dimension of phase change material and reducing the dimension of the heating electrode; meanwhile, it is also an useful method to effectively prevent thermal diffusion in reversible phase change by the dielectric transition layer between the electrode and phase change material for the purpose of low voltage and low power consumption.

Furthermore, as the integrated circuits technology and the CMOS process develop into 45 nm and 22 nm, the low-k dielectric material are used more frequently in the CMOS circuits. By using low-k dielectric material as the inter layer dielectrics (ILD), the parasitic capacitance and signal crosstalk can be reduced such that the distance between interconnecting wires can be narrowed to further enhance the chip integrated level, and meanwhile, by using the low-k dielectric material, the signal transmission delay is reduced to increase chip speed.

SUMMARY OF THE INVENTION

An object of the present invention is to provide a phase change memory structure having low-k dielectric heat-insulating material and fabrication method thereof.

In order to achieve the above object and others, the present invention adopts the following technical scheme:

A phase change memory structure having low-k dielectric heat-insulating material, comprising a substrate and a phase change memory cell array composed of a plurality of phase change memory cells on said substrate;

Wherein, each of said phase change memory cell comprises:
a diode;
a heating electrode on said diode;
a reversible phase change resistor on said heating electrode;
a top electrode on said reversible phase change resistor;
low-k dielectric heat-insulating layer surrounding said heating electrode and reversible phase change resistor;
an anti-diffusion dielectric layer designed between said reversible phase change resistor and the low-k dielectric heat-insulating layer surrounding thereof.

Preferably, said substrate can be common silicon (Si) substrate, and can also be silicon on insulator (SOI) substrate or other semiconductor substrate.

Said heating electrode, which is subject to no limitation, can be common conducting material such as tungsten (W) and platinum (Pt), and can also be other conducting material such as titanium nitride (TiN), titanium tungsten (TiW), titanium aluminum nitride (TiAlN), used to promote the heating effect and reduce the operation current.

Said low-k dielectric heat-insulating layer adopts low-k dielectric material, comprising low-k doped oxide, low-k organic polymer and low-k porous material. Preferably, said low-k dielectric heat-insulating layer adopts fluorine-doped silicon oxide (SiOF), porous carbon-doped silicon oxide (SiOC), spin-on organic polymeric dielectric, spin-on silicone based polymeric dielectric, porous silicon low k (SiLK), porous silicon oxide or etc.

Said top electrode, which is subject to no limitation, can be common conducting material such as aluminum (Al), tungsten (W) and copper (Cu), and can also be other conducting material such as TiN.

Preferably, said anti-diffusion dielectric layer can adopt nitride such as silicon nitride (SiN) and silicon oxynitride (SiON), or oxide such as tantalum oxide ($Ta_2O_5$), aluminum oxide ($Al_2O_3$) and zirconium oxide ($ZrO_2$), used to effectively prevent phase material from diffusing, enhance the adhesion of phase change material and promote the heating effect and reliability of phase change material.

Preferably, said reversible phase change resistor can adopt phase change material of GeSbTe, SiSbTe, or GeSbTe dopted with Sn, Ag, N, or SiSbTe dopted with Sn, Ag, N.

The present invention further provides a fabrication method of the aforementioned phase change memory structure having low-k dielectric heat-insulating material, comprising the following steps:

(1) fabricate diode array by standard CMOS process;
(2) form a first low-k dielectric heat-insulating layer of a thickness in the range of 50 nm to 1000 nm on the diode array;

(3) form a plurality of first holes of a diameter in the range of 30 nm to 300 nm on the first low-k dielectric heat-insulating layer, wherein the bottom of each first hole is connected to the top of each diode in the diode array;

(4) fill heating electrode material in said holes, and then carry out the chemical mechanical polishing (CMP) process to remove the remaining heating electrode material from the surface so as to form the cylindrical heating electrode array;

(5) form a second low-k dielectric heat-insulating layer of a thickness in the range of 50 nm to 200 nm on the cylindrical heating electrode array; form a plurality of second holes of a diameter in the range of 50 nm to 500 nm on the second low-k dielectric heat-insulating layer, wherein the bottom of each second hole is connected to the top of each cylindrical heating electrode in the cylindrical heating electrode array;

(6) form an anti-diffusion dielectric layer of a thickness in the range of 1 nm to 30 nm in the second holes;

(7) fill phase change material in the second holes after the formation of an anti-diffusion dielectric layer therein, and then carry out the CMP process to remove the remaining phase change material from the surface so as to form the cylindrical reversible phase change resistor array;

(8) form a layer of electrode material on the cylindrical reversible phase change resistor array;

(9) form top electrodes of the phase change memory cell array by lithography and wet etch.

Preferably, said first and second low-k dielectric heat-insulating layers are formed by low-k dielectric material, comprising low-k doped oxide, low-k organic polymer and low-k porous material. Preferably, said first and second low-k dielectric heat-insulating layers adopt fluorine-doped silicon oxide (SiOF), porous carbon-doped silicon oxide (SiOC), spin-on organic polymeric dielectric, spin-on silicone based polymeric dielectric, porous SiLK, porous silicon oxide and etc.

Preferably, said first and second holes are formed by focused ion beam or electron beam lithography, reactive ion etching and etc.

Preferably, said anti-diffusion dielectric layer is formed by atomic layer deposition (ALD) or chemical vapor deposition (CVD).

Preferably, the second low-k dielectric heat-insulating layer and phase change material are polished by a colloidal silica slurry under a polishing pressure below 0.5 psi during the CMP process of step (7). By use of the slurry's high selectivity of phase change material to low-k dielectric (≥60:1) and low damage (light corrosion, film stability, no change to volume and thermal mechanical properties) for low-k dielectric, the polishing can be performed to the phase change material and stopped on the second low-k dielectric heat-insulating layer.

The present invention provides a phase change memory structure having low-k dielectric heat-insulating material and fabrication method thereof, wherein low-k dielectric heat-insulating material is used as the heat-insulating material of the phase change memory in the region outside of the heating electrode and phase change resistor, wisely making use of the properties of low-k dielectric material to enhance the device performance of phase change memory.

Due to the low dielectric constant, low-k dielectric material is generally used as inter layer dielectrics (ILD) to reduce parasitic capacitance and signal crosstalk, enhance chip integrated level, shorten signal transmission delay, increase chip speed and so on. However, low-k dielectric material often has porous structure and features soft quality, low density, poor thermal conductivity, making it difficult to be used in CMOS. The present invention, giving a full play to these features of low-k dielectric material, utilizes low-k dielectric material as heat-insulating material for phase change memory, thereby avoiding thermal crosstalk and mutual influence during operation between phase change memory cells. Meanwhile, good scalability of low-k dielectric material reduces the influence of pressure caused by volume change during phase change of phase change material on memory cells, thereby enhancing the reliability of devices and eliminating the influence of temperature, pressure and etc. on phase change random access memory (PCRAM) data retention during the change from amorphous to polycrystalline states. Moreover, due to soft structure and high permeability of low-k dielectric material, an anti-diffusion dielectric layer is prepared between the low-k dielectric material and the phase change material to prevent the elements of the phase change material such as GST from diffusing to low-k dielectric material.

With regard to the manufacturing process, diode switches or peripheral circuits are fabricated by standard CMOS process and reversible phase change resistors are fabricated by subsequent special process that will not influence standard CMOS process. During the polishing process, the CMP process with low pressure and light corrosion is adopted, thereby avoiding the damage to devices caused by the polishing process.

Figure 1:
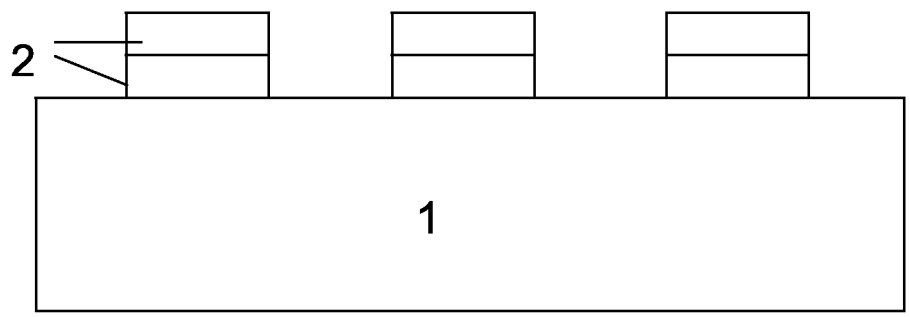
FIG. 1-FIG. 6 are schematic views of the process flow for phase change memory structure prepared in embodiments. The final phase change memory structure is shown in FIG. 6, wherein the accompany drawings reference signs are described as below.

1. substrate; 2. diode; 3. first low-k dielectric heat-insulating layer; 4. heating electrode; 5. second low-k dielectric heat-insulating layer; 6. anti-diffusion dielectric layer; 7. reversible phase change resistor; 8. top electrode

DETAILED DESCRIPTION OF THE EMBODIMENTS

The present invention is further detailed below with reference to the drawings. The present invention provides preferred embodiments, but the embodiments described shall not be interpreted as a limitation. In order to illustrate the structures in a more explicit manner, the thickness of the layer and region is properly magnified in the drawings; however, the schematic drawings shall not be regarded as an exact representation of the geometric proportion. Illustration of the drawings is only on a schematic basis and shall not be construed as a limitation of the scope of the present invention.

Figure 6:
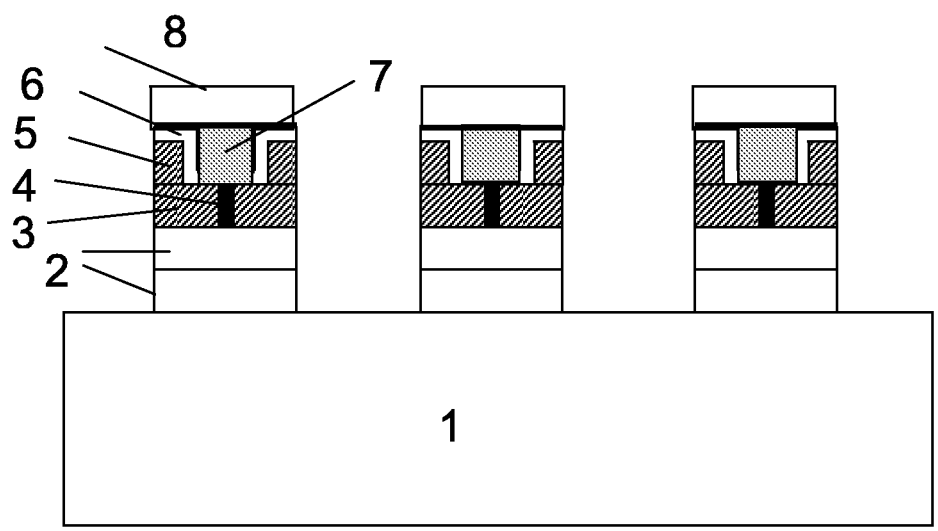

Please refer to FIG. 6. The present invention provides a phase change memory structure having low-k dielectric heat-insulating material, comprising a substrate 1 and a phase change memory cell array composed of a plurality of phase change memory cells on said substrate 1. Generally, a phase change memory cell is composed of a reversible phase change resistor and a diode, wherein the reversible change between amorphous (high resistance) state and polycrystalline (low resistance) state of reversible phase change resistor is realized by the operation of heating electrode. The present invention provides a phase change memory cell, comprising the following: a diode 2; a heating electrode 4 on the diode 2; a reversible phase change resistor 7 on the heating electrode 4; a top electrode 8 on the reversible phase change resistor 7; a first low-k dielectric heat-insulating layer 3 and a second low-k dielectric heat-insulating layer 5 surrounding the heating electrode 4 and reversible phase change resistor 7, respectively; an anti-diffusion dielectric layer 6 designed between the reversible phase change resistor 7 and the second low-k dielectric heat-insulating layer 5 surrounding thereof.

Wherein, substrate 1 can be common Si substrate, and can also be SOI substrate or other semiconductor substrate. Heating electrode 4, which is subject to no limitation, can be common conducting material such as W and Pt, and can also be other conducting material such as TiN, TiW, TiAlN, used to promote the heating effect and reduce the operation current. Top electrode, which is subject to no limitation, can be common conducting material such as Al, W and Cu, and can also be other conducting material such as TiN.

First low-k dielectric heat-insulating layer 3 and second low-k dielectric heat-insulating layer 5 adopt low-k dielectric material, comprising low-k doped oxide, low-k organic polymer and low-k porous material. Preferably, first low-k dielectric heat-insulating layer 3 and second low-k dielectric heat-insulating layer 5 adopt fluorine-doped silicon oxide (SiOF), porous carbon-doped silicon oxide (SiOC), spin-on organic polymeric dielectric, spin-on silicone based polymeric dielectric, porous SiLK, porous silicon oxide or etc. Since these low-k dielectric materials have porous structure, and features soft quality, low density and poor thermal conductivity, they can be used as heat-insulating materials for phase change memory to avoid thermal crosstalk and mutual influence during operation between phase change memory cells. Meanwhile, good scalability of low-k dielectric materials reduce the influence of pressure caused by volume change during phase change of phase change material on memory cells, thereby enhancing the reliability of devices and eliminating the influence of temperature, pressure and etc. on PCRAM data retention during the change from amorphous to polycrystalline states.

Preferably, anti-diffusion dielectric layer 6 can adopt nitride such as SiN and SiON, or oxide such as $Ta_2O_5$, $Al_2O_3$ and $ZrO_2$, used to effectively prevent phase material (reversible phase change resistor 7) from diffusing, enhance the adhesion of phase change material and promote the heating effect and reliability of phase change material.

Embodiment 1

Figure 2:
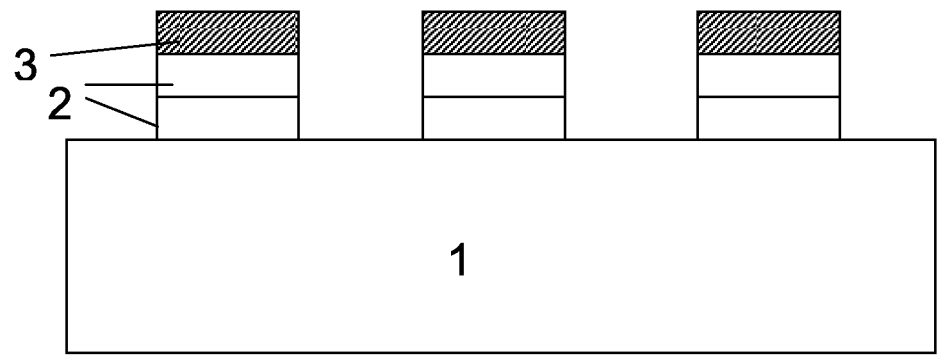
Figure 3:
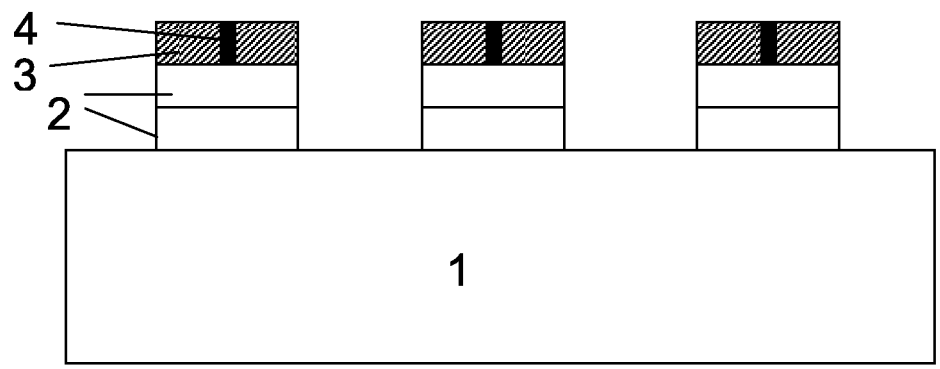
Figure 4:
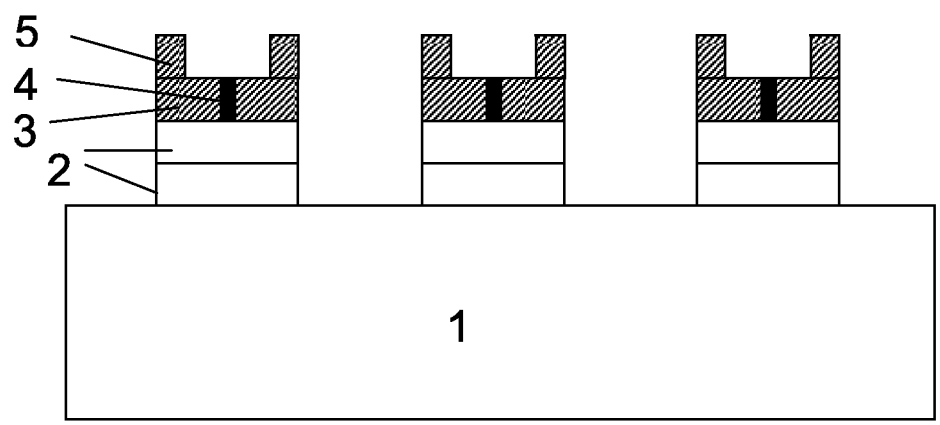
Figure 5:
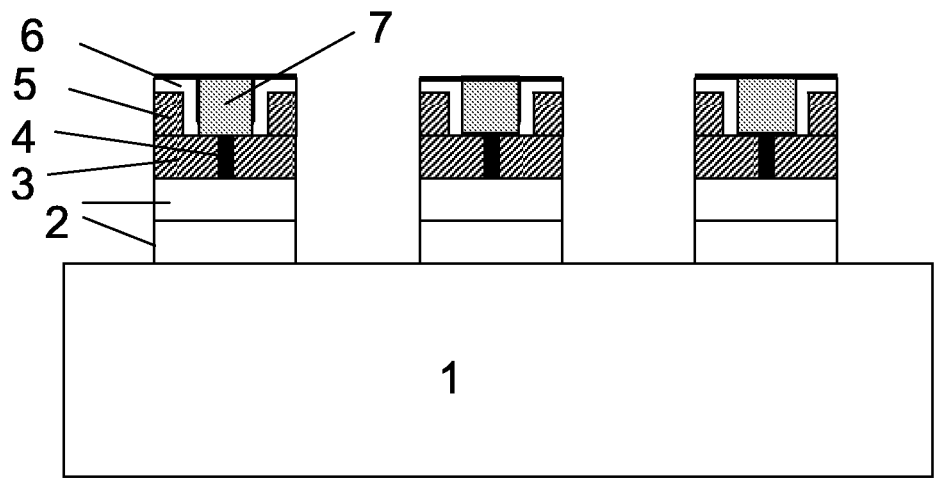

Please refer to FIG. 1-FIG. 6, which show a fabrication method of a phase change memory structure having low-k dielectric heat-insulating material, comprising the following steps:

(1) as shown in FIG. 1, fabricate a diode array of a dimension in the range of 100 nm to 1000 nm composed of a plurality of diodes 2 on substrate 1 by standard CMOS process to be used as the switches of the phase change memory cell array;

(2) as shown in FIG. 2, form a first low-k dielectric heat-insulating layer 3 of a thickness in the range of 100 nm to 500 nm on the diode array by metal organic chemical vapor deposition (MOCVD);

(3) form nano-holes of a diameter in the range of 100 nm to 300 nm on said 100-500 nm thick first low-k dielectric heat-insulating layer 3, wherein the bottoms of holes are connected to the top of diodes 2;

(4) deposit W thin film in said holes by CVD until the holes are filled up;

(5) remove the electrode material of W from the region outside of holes by chemical mechanical polishing (CMP) to form the heating electrodes 4 as shown in FIG. 3;

(6) deposit a second low-k heat-insulating layer 5 of a thickness in the range of 50 nm to 200 nm on the W electrodes by MOCVD;

(7) form nano-holes of a diameter in the range of 50 nm to 500 nm on said 50-200 nm thick second low-k dielectric heat-insulating layer 5, wherein the bottoms of holes are connected to the top of W electrodes, as shown in FIG. 4;

(8) deposit SiN thin film of a thickness in the range of 5 nm to 20 nm in said holes by plasma enhanced chemical vapor deposition (PECVD) to be used as anti-diffusion dielectric layer 6;

(9) sputter phase change material GeSbTe of a thickness about 100 nm by magnetron sputtering to form reversible phase change resistor 7, with a base vacuum of $3 \times 10^{-6}$ Ton ($4.0 \times 10^{-4}$ Pa), a sputtering pressure of 0.08 Pa, a power of 100 W;

(10) remove GeSbTe thin film from the region outside of holes by CMP, and then fabricate Al top electrodes so as to form phase change memory cells with 1D1R structure on Si substrate, as shown in FIG. 6.

Embodiment 2

Replace the SiN thin film in step (8) of embodiment 1 by a SiON thin film of a thickness in the range of 5 nm to 20 nm, while remain other steps the same as specified in embodiment 1, then a result similar to that of embodiment 1 can also be achieved.

Embodiment 3

Replace the W heating electrode of embodiment 1 by TiN or other materials having higher resistivity, while remain other steps the same as specified in embodiment 1, then a result better than that of embodiment 1 can be achieved.

Embodiment 4

Replace the Si substrate of embodiment 1 by SOI substrate or other semiconductor substrate, while remain other steps the same as specified in embodiment 1, then a result similar to that of embodiment 1 can be achieved with even some properties (e.g., anti-radiation) improved.

Embodiment 5

Replace the phase change material GeSbTe of embodiment 1 by SiSbTe, or GeSbTe dopted with Sn, Ag, N, or SiSbTe dopted with Sn, Ag, N, while remain other steps the same as specified in embodiment 1, then better device performance can be achieved, such as reducing the device operation current or increasing the device speed.

Other process conditions involved in the present invention are conventional process conditions within the field of those skilled in the art and as such will not be discussed herein. The aforementioned embodiments are only a description of the technical schemes of the present invention, but are not a limitation of the present invention. Any technical scheme within the spirit and scope of the present invention shall be included in the scope of the claims of the present invention.

What is claimed is:

1. A fabrication method of a phase change memory structure having low-k dielectric heat-insulating material, characterized by comprising the following steps:
   (1) fabricate diode array by standard CMOS process;
   (2) form a first low-k dielectric heat-insulating layer of a thickness in the range of 50 nm to 1000 nm on the diode array;
   (3) form a plurality of first holes of a diameter in the range of 30 nm to 300 nm on the first low-k dielectric heat-insulating layer, wherein the bottom of each first hole is connected to the top of each diode in the diode array;
   (4) fill heating electrode material in said holes, and then carry out the chemical mechanical polishing (CMP) process to remove the remaining heating electrode material from the surface so as to form the cylindrical heating electrode array;
   (5) form a second low-k dielectric heat-insulating layer of a thickness in the range of 50 nm to 200 nm on the cylindrical heating electrode array; form a plurality of second holes of a diameter in the range of 50 nm to 500 nm on the second low-k dielectric heat-insulating layer, wherein the bottom of each second hole is connected to the top of each cylindrical heating electrode in the cylindrical heating electrode array;
   (6) form an anti-diffusion dielectric layer of a thickness in the range of 1 nm to 30 nm in the second holes;
   (7) fill phase change material in the second holes after the formation of an anti-diffusion dielectric layer therein, and then carry out the CMP process to remove the remaining phase change material from the surface so as to form the cylindrical reversible phase change resistor array;
   (8) form a layer of electrode material on the cylindrical reversible phase change resistor array;
   (9) form top electrodes of the phase change memory cell array by lithography and wet etch.

2. The fabrication method of a phase change memory structure having low-k dielectric heat-insulating material according to claim 1, characterized in that said first and second low-k dielectric heat-insulating layers are formed by low-k dielectric material, wherein said low-k dielectric material comprises low-k doped oxide, low-k organic polymer and low-k porous material.

3. The fabrication method of a phase change memory structure having low-k dielectric heat-insulating material according to claim 2, characterized in that said first and second low-k dielectric heat-insulating layers adopt fluorine-doped silicon oxide, porous carbon-doped silicon oxide, spin-on organic polymeric dielectric, spin-on silicone based polymeric dielectric, porous SiLK or porous silicon oxide material.

4. The fabrication method of a phase change memory structure having low-k dielectric heat-insulating material according to claim 1, characterized in that said first and second holes are formed by focused ion beam or electron beam lithography and reactive ion etching.

5. The fabrication method of a phase change memory structure having low-k dielectric heat-insulating material according to claim 1, characterized in that said anti-diffusion dielectric layer is formed by atomic layer deposition (ALD) or chemical vapor deposition (CVD).

6. The fabrication method of a phase change memory structure having low-k dielectric heat-insulating material according to claim 1, characterized by the CMP process adopted by step (7), wherein the second low-k dielectric heat-insulating layer and phase change material are polished by a colloidal silica slurry under a polishing pressure below 0.5 psi.

* * * * *